US010431976B2

(12) United States Patent
Uan-Zo-li et al.

(10) Patent No.: US 10,431,976 B2
(45) Date of Patent: Oct. 1, 2019

(54) MECHANISM TO EXTEND THE PEAK POWER CAPABILITY OF A MOBILE PLATFORM

(71) Applicant: Intel Corporation, Santa Clara, CA (US)

(72) Inventors: Alexander B. Uan-Zo-li, Hillsboro, OR (US); Eugene Gorbatov, Hillsboro, OR (US); Chee Lim Nge, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 237 days.

(21) Appl. No.: 15/466,498

(22) Filed: Mar. 22, 2017

(65) Prior Publication Data

US 2018/0278053 A1    Sep. 27, 2018

(51) Int. Cl.
| | | |
|---|---|---|
| *H02J 1/00* | (2006.01) | |
| *H02J 7/00* | (2006.01) | |
| *G01R 31/3835* | (2019.01) | |
| *H02J 1/02* | (2006.01) | |
| *H02J 7/34* | (2006.01) | |

(52) U.S. Cl.
CPC ............ *H02J 1/00* (2013.01); *G01R 31/3835* (2019.01); *H02J 1/02* (2013.01); *H02J 7/007* (2013.01); *H02J 7/0052* (2013.01); *H02J 7/345* (2013.01)

(58) Field of Classification Search
CPC . H02J 1/00; H02J 7/0052; H02J 7/007; G01R 31/362; H01R 24/64
See application file for complete search history.

(56) References Cited

U.S. PATENT DOCUMENTS

| | | | |
|---|---|---|---|
| 2008/0197707 A1* | 8/2008 | Chi Yang | H02J 7/0068 307/71 |
| 2009/0206657 A1* | 8/2009 | Vuk | H01M 10/4264 307/9.1 |
| 2011/0244929 A1 | 10/2011 | Manor | |
| 2012/0091813 A1 | 4/2012 | Spurlin et al. | |
| 2014/0095897 A1 | 4/2014 | Ji et al. | |
| 2014/0355308 A1 | 12/2014 | Uan-Zo-Li et al. | |
| 2015/0340897 A1 | 11/2015 | Uan-Zo-Li et al. | |
| 2016/0306014 A1* | 10/2016 | Jeon | G01R 31/3682 |
| 2016/0332532 A1 | 11/2016 | Ro | |

OTHER PUBLICATIONS

PCT Application No. PCT/US2018/019043, Notification of Transmittal of the International Search Report and the Written Opinion of the International Searching Authority, dated May 24, 2018, 14 pgs.

* cited by examiner

*Primary Examiner* — Jared Fureman
*Assistant Examiner* — Duc M Pham
(74) *Attorney, Agent, or Firm* — Womble Bond Dickinson (US) LLP

(57) ABSTRACT

A method and apparatus for extending peak power capability of a computing device. In one embodiment, the apparatus comprises: voltage monitoring hardware to monitor voltage being supplied by a battery to a system load; and an energy storage coupled to the voltage monitoring hardware and/or charging scheme to supplement supply of power to the system load when the voltage supplied to the system load by the battery, as monitored by the voltage monitoring hardware, drops below a first threshold voltage level, the first threshold voltage level being above a minimum voltage level associated with the computing system.

23 Claims, 7 Drawing Sheets

US 10,431,976 B2

MECHANISM TO EXTEND THE PEAK POWER CAPABILITY OF A MOBILE PLATFORM

FIELD OF THE INVENTION

Embodiments of the present invention relate to the field of computing devices; more particularly, embodiments of the present invention relate to supplementing power provided by a battery to power a computing system, such as a mobile device (e.g., laptop computer, smart phone, etc.).

BACKGROUND OF THE INVENTION

Today, mobile industry is moving towards smaller and smaller form factors. At the same time, the central processing units (CPUs) of the mobile computing devices are consuming more power, and the thermal cooling is becoming more complex. The CPU peak power requirements are increasing almost exponentially, while the rest of the platform peak power requirements increase.

Another development in the mobile industry is the use of Type C Universal Serial Bus (USB) connectors. The inclusion of Type C USB connectors in mobile platforms means that one connector for designs that are smaller in size must be able to provide 15 W through the USB Type C connector. For example, a mouse connected to the Type C USB port may be recognized as a passive load that requires a lot of power.

Today, some computing platforms are being used with 2S batteries, i.e. batteries which are built of two cells in series (with a possibility of having 2 more in parallel). The reason this battery configuration is used to have a smaller voltage regulator (VR) size, which can be accomplished by having a higher switching frequency. Higher voltages (3S or 4S) are normally reserved for larger systems. Some systems are built with even lower input voltage, with 1 battery cell in series, and 1 or 2 in parallel (1S1P or 1S2P). This is optimized for phones and tablets, and shows switching regulators of particularly low size and high efficiency.

While some computing systems use a 2S configuration, there is interest in moving to a 1S system. Unfortunately, higher peak power requirements for high-performing CPUs make the usage of a 1S battery configuration rather difficult. Such configurations are difficult to implement because systems have a limitation on their minimum input voltage, which is, for example, 2.5V for a 1S system and ~5.4V for a 2S system. These limitations are driven by the 5V voltage regulator minimum voltage (e.g., 5.4V for a 2S system) and limitations on the use of a power management integrated circuit (PMIC) (e.g., 2.5V for a 1S system, 5.4V for a 2S system). With a higher power jump during certain modes (e.g., CPU Turbo mode) and a power burst of the rest of the platform (ROP) that may possibly accompany the jump in power, it is quite possible that the total system voltage would droop below the minimum allowed system voltage of the computing system. In some systems, this risk requires limiting the peak frequency in a multi-threaded operation, which may negatively affect the performance of the system. It's also understood that when a device (storage, mouse, phone) is connected to a Type C connector, the peak CPU performance may be constrained even further.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Figure 1A:
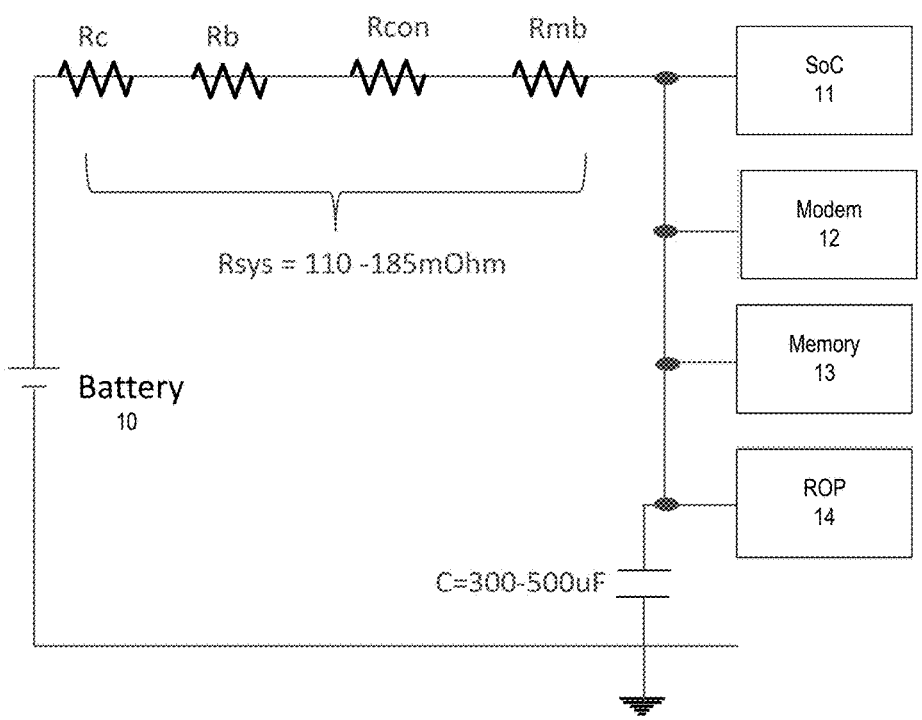
FIG. 1A illustrates a general schematic of a 2S computing system.

FIG. 1A illustrates simplified view of a mobile computing system. Referring to FIG. 1A, the computing system includes a battery 10 that provides power to a System-on-Chip (SoC) 11 (or other processing device), modem (or other communication device) 12, memory 13 and the rest of the platform (ROP) 14. In one embodiment, dependent on the battery configuration (e.g., 2S1P or 2S2P), the resistance from the battery cells to each voltage regulator (VR) input (not shown) that supplies power to each of SoC 11, modem 12, memory 13 and ROP 14 can vary from 110 mOhm to 185 mOhm. Note that the values on another system can be lower of higher dependent on the system design and the battery configuration. The resistance may cause the voltage seen by the system from the battery cells to droop when the power is being used by the system components and being provided by the battery. The resistance also may change based on temperature, battery wear-out, battery state of charge, power load and variation between components. A difference between 110 mOhm and 185 mOhm results in considerable difference in the peak power the system of FIG. 1A can support. If the voltage being supplied to the system drops below the minimum system voltage required by the voltage regulators to operate correctly, the system may suffer irreparable damage or black screen.

One way to accommodate a potential under-voltage situation is to assert a Prochot# signal that is received by the central processing unit (CPU) and causes the CPU to cuts its operation in order to protect the system from under-voltage. This solution has some disadvantages. First, cutting the CPU's operation may be done prematurely, thereby hurting system performance, particularly for the case of 2S1P battery. Second, connecting a small device to a Type C port in the system may lead to a dramatic cut in multi-threated performance, if the SoC peak power is required to be reduced. Third, this solution relies on enabling on the ROP, namely the modem hardware communication with the system, as well as display, memory, speakers, etc. to communicate through the operating system (OS). Fourth, this solution requires a very complex calculation algorithm for the proper setting of the threshold voltage to make sure use of the Prochot# signal is not used inadvertently. Even more acute problem arises for a 1S system, where the resistance is larger compared to the peak current, and the performance may even more difficult to maintain.

The techniques described herein overcome these problems by enabling the power delivery system to supplement the battery power to the system with power from the existing (or slightly increased or potentially modified) input decoupling in the power delivery system, e.g. the charger VR. In the case where the system is using high power and the system voltage starts to droop, the power delivery system uses energy from the existent energy storage to supplement the power delivered from the battery to the system to ensure that the system voltage remains above the system voltage minimum (i.e., the minimum voltage the system needs to be supplied to operate properly).

Figure 1B:
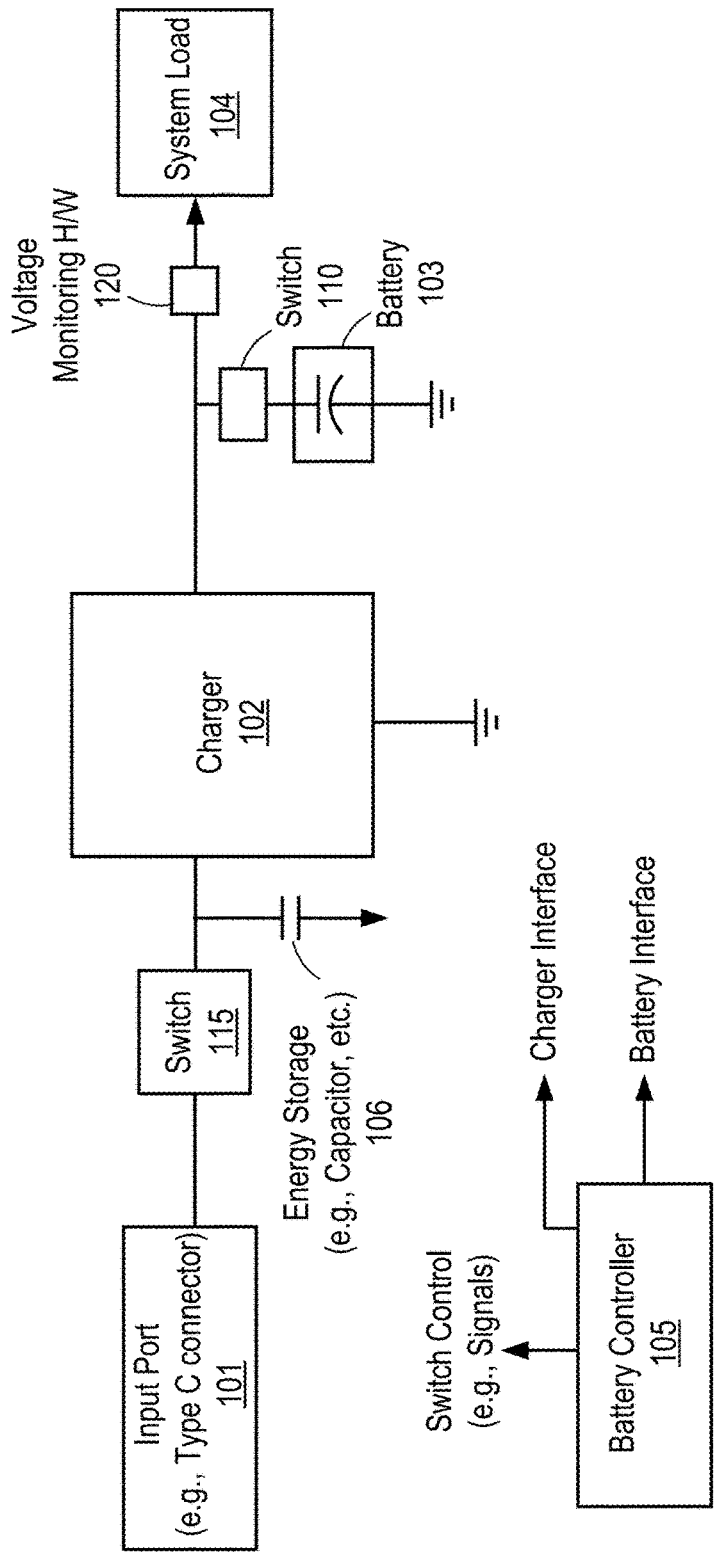
FIG. 1B is a block diagram of a mobile computing system that includes energy storage to supplement battery power provided to the system in accordance with the disclosure.

FIG. 1B is a block diagram of a mobile power supply system. Referring to FIG. 1B, a charger 102 provides power to a system load 104 and charges the battery when the adapter is connected at the input port 101. In one embodiment, system load 104 is a mobile computing system, such as, for example, but not limited to, a smartphone, tablet, laptop computer. Such a system load 104 often has a processor, a memory, one or more communication devices, and other components that make up the rest of the platform that are powered by rechargeable battery 103 and potentially by power from an external power source (e.g., an adapter, etc.) (not shown). In one embodiment, battery 103 provides power to system load 104 when an external power source is not available. In one embodiment, battery 103 is a lithium-ion battery pack. Note that the embodiments described herein are not limited to use of a lithium-ion battery pack and other rechargeable or non-rechargeable batteries may be used.

In one embodiment, the power delivery system includes energy storage 106 which supplements the voltage provided by battery 103 to system load 104 in certain situations. In one embodiment, energy storage 106 comprises a component(s) for input decoupling of the charger in the form of one or more capacitors (e.g., a ceramic capacitor, an electrolytic capacitor, etc.) coupled together (e.g., in series). In one embodiment, the capacitor of energy storage 106 is implemented by one or more individual capacitors coupled together in parallel or series.

In one embodiment, energy storage 106 supplements power to system load 104 to maintain the voltage being supplied to system load 104 above the minimum voltage level. This may occur when the voltage provided by battery 103 droops below a predetermined voltage level. The predetermined voltage level may be a threshold voltage level that is set above the minimum voltage level of the system. In such a case, when the voltage droops below the threshold voltage level, energy storage 106 is used by the charger to generate the power to supplement the power provided by battery 103 to system load 104.

In one embodiment, a monitoring hardware 120 monitors the voltage and or power provided to system load 104 to determine if the voltage droops below the predetermined level (or the power goes above the battery capability). In one embodiment, voltage monitoring hardware 120 monitors the voltage being supplied by battery 103 to system load 104 and energy storage 106 (e.g., a capacitor) coupled to voltage monitoring hardware 120 supplements the supply of power to system load 104 when the voltage supplied to system load 104 by battery 103, as monitored by voltage monitoring hardware 120, drops below a first threshold voltage level, which is above a minimum voltage level associated with system load 104.

In another embodiment, the voltage monitoring can be done by the charger controller, which is also tasked with asserting a signal when the voltage droops below a predetermined level.

Note that current or power may be monitored instead of voltage to determine if the voltage provided to system load 104 has dropped or may drop below the predetermined level.

In one embodiment, charger 102 charges battery 103 and at times charges energy storage 106 when the AC adapter is not present at the input port. In one embodiment, battery charger 102 also charges energy storage 106 when the voltage being supplied by battery 103 to system load 104 is above a second threshold level that is higher than another (first) threshold level that is used to trigger the usage of energy storage 106 to supplement power to system load 104. In such a case, battery charger 102 does not charge energy storage 106 when the voltage being supplied by battery 103 to system load 104 is below the second threshold level but higher than the first threshold level. In one embodiment, voltage monitoring hardware 120 monitors the voltage being supplied by battery 103 to system load 104 to determine when battery charger 102 charges energy storage 106.

In one embodiment, charger 102 maintains the necessary amount of energy in energy storage 106, unless the SoC goes into a low power mode, and there is no possibility of the system load to spike to the level sufficient to droop the system voltage below the minimum system requirements.

Switch 115 is used to decouple input port 101 from battery charger 102 and energy storage 106 when no device is connected to the Input Port 101.

In one embodiment, energy storage 106 is discharged to battery 103 when a power adaptor is coupled to input port 101. In one embodiment, energy storage 106 is discharged in response to the power adaptor being connected to input port 101 but prior to the adaptor providing power to system load 104 through input port 101.

In one embodiment, battery controller 105 is coupled to and controls the components of the power deliver system of FIG. 1 to determine when energy storage 106 is to supplement the power provided by battery 103 to system load 104, charge and discharge energy storage 106, as well as couple and decouple components at specific times.

In one embodiment, the power supply system includes a switch 110 (e.g., one or more pass field effect transistors (FETs)) to decouple battery 103 from system load 104 and/or battery charger 102. In one embodiment, switch 110 is used when an external power source (e.g., a power adaptor) is coupled to provide power to system load 104. In one embodiment, an external power source may be coupled to system load 104 via input port 101. In one embodiment, the power source comprises a power source of undetermined output power. In one embodiment where input port 101 is a Type C USB connector, the power source is a Universal Serial Bus (USB) Power Delivery (PD) power supply. In one embodiment, the power source is a wireless power source. In another embodiment, the power source is a solar power source.

In some embodiments, the energy storage 106 or a portion of it can be disconnected from the system with a switch in order to minimize its leakage or in order to avoid the necessity to fully discharge it when a device is connected at the input port 101 and the switch 115 is turned on.

Figure 2:
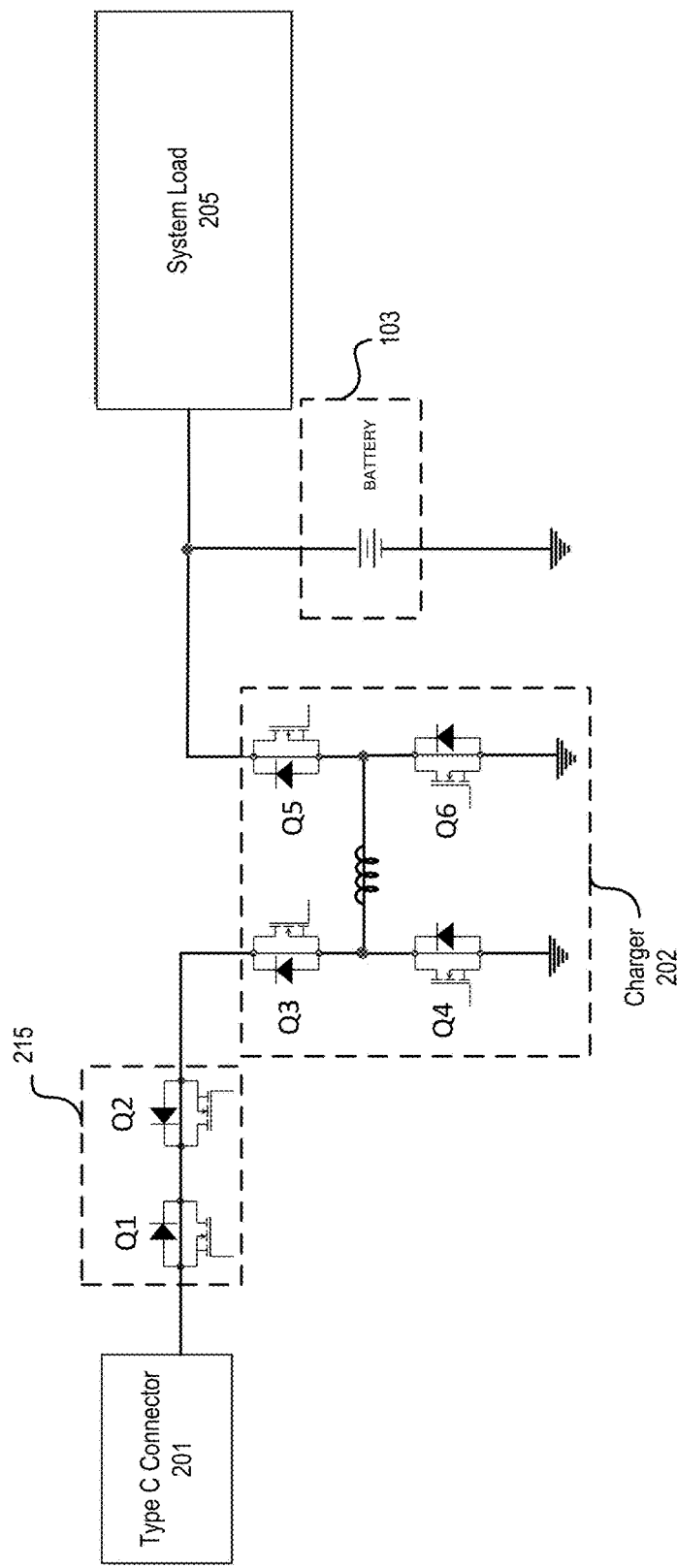
FIG. 2 shows a schematic for a Type C charging system.

FIG. 2 shows a typical schematic for a Type C charging system with a battery with 2 cells or more in series.

Referring to FIG. 2, a switch 215 comprising field effect transistors (FETs) Q1 and Q2 are used to block the voltage when Type C connector 201 is not used or when a device is connected to it, while FETs Q3-Q6 are used with an inductor for the buck-boost charger 202, which is well-known in the art. Note that some configurations (e.g., is battery) may omit the FETs Q5 and Q6. This configuration is used for a Type C connector system, which can charge battery 103 from an input voltage source of 5V to 20V through Type C connector 201.

Figure 3:
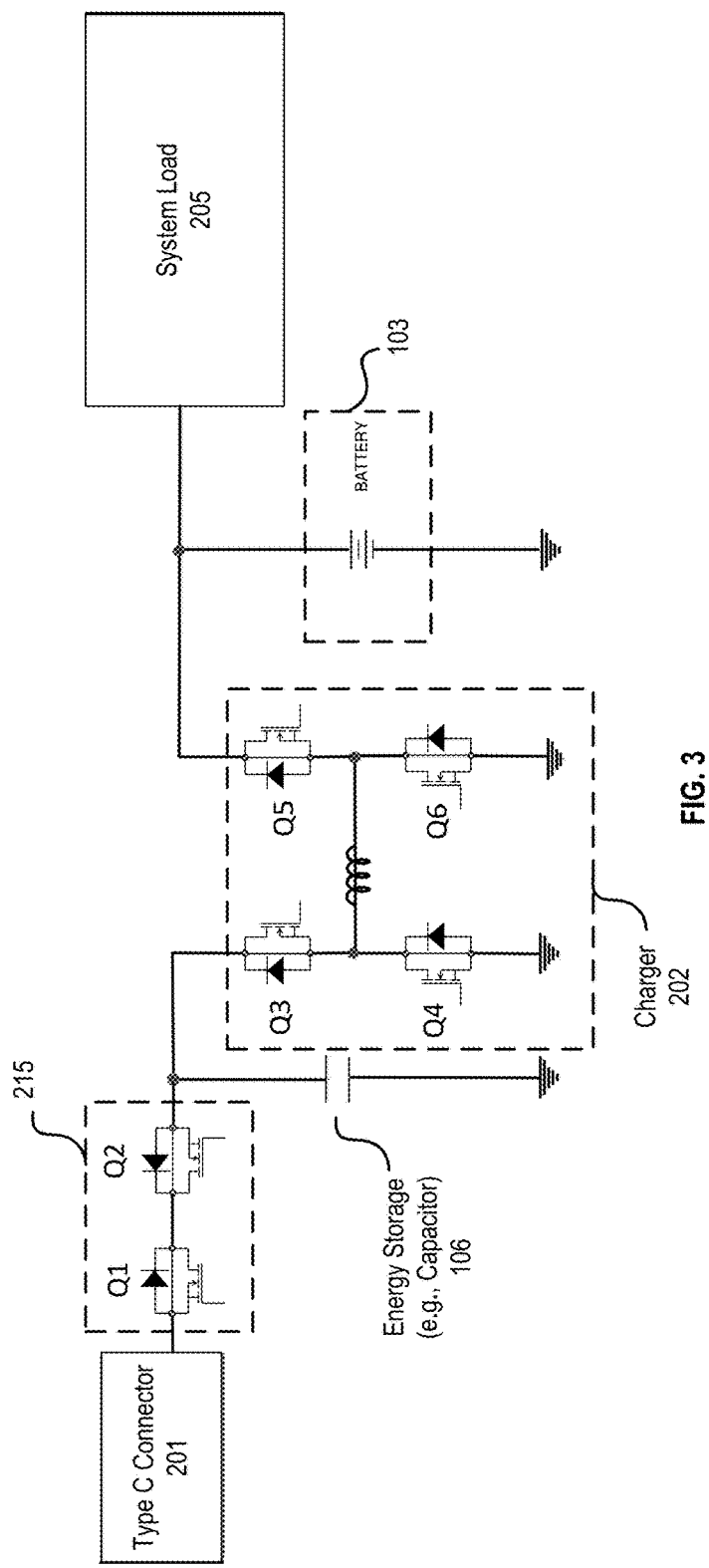
FIG. 3 illustrates one embodiment of circuit for a Type C charger.

FIG. 3 illustrates one embodiment of circuit for a power supply system. This circuit allows a much higher peak power than is possible today. Note that the circuit looks almost identical to that of FIG. 2, with a small change of an added energy storage 106 (e.g., capacitor C). As discussed above, energy storage 106 may be one or more components that collectively provide an energy storage unit or mechanism. Note also that the energy storage component 106 could be the component(s) that performs the existing input decoupling of charger 202.

One main difference between the configurations of FIGS. 2 and 3 is that the charger is used now very differently when in battery mode in FIG. 3. The added (or re-used) capacitor C becomes an energy storage component for the normal operation, when system load 205 is operated off battery 103, the total system power is below the capacity of battery 103, and the system voltage is at high level (e.g., well above 5.4V for a 2S system and 2.5V for a 1S system). In one embodiment, the capacitor is charged to 20V, a normal voltage of an Ultrabook adapter, and a specified voltage of a Type C adapter. Note that the capacitor could be charged to other voltage levels.

In one embodiment, when system load 205 starts drawing sufficiently high power for sufficiently long time, charger 202 compensates some of that draw by discharging energy storage 106 (e.g., storage capacitor C) and supplementing the battery, thereby protecting the system voltage from drooping below the minimum voltage level of the system load (e.g., 5.4V for a 2S system and 2.5V for a 1S system). In one embodiment, the battery controller also asserts a Prochot# signal to instruct the CPU of system load 104 to reduce its power consumption (e.g., enter a low power mode or other reduced power consumption state). In one embodiment, asserting Prochot# allows quick cut in the CPU peak power (e.g., 10 us). It is also well known in the art that the system load rarely comes close to the situation in which the total system voltage droops to dangerously low levels, but since such a situation is possible, the CPU peak frequency must be kept at low enough value as to prevent the system from blue or black screening.

After the Prochot# signal is asserted and system load 104 enters and remains in a reduced power consumption state, energy storage 106 is recharged. In one embodiment, system load 104 is in the reduced power consumption state for sufficient amount of time to recharge energy from the storage 106 (e.g., recharge the capacitor C) (the time is measured in tens of us).

In one embodiment, in order to make an operating mode possible in which an energy storage (e.g., capacitor) is used to supplement battery power to ensure the system voltage doesn't droop below is minimum value, the power supply system with its charger has the following features.

First, in one embodiment, the power delivery system includes a "protection ready" mode, where battery charger 202 charges energy storage 106 (e.g., an input capacitor) to a predetermined voltage (e.g., 20V) when the system is in high mode (e.g., state S0) for use in supplementing the battery power to the system load in the future. In one embodiment, the charger also maintains the energy storage 106 in charged state, and compensates for the potential leakage in the energy storage Second, the power delivery system includes a "protection" mode in which the system voltage droop to a threshold voltage is detected, and energy storage 106 (e.g., an input capacitor) is supplementing the battery in order to keep the voltage from drooping below the minimum allowable level. Note that in this mode, the charger starts operating and transmits the energy stored in the energy storage to the system load.

Third, the battery controller implements a new sequencing related to when an adapter or load is connected to Type C connector 201. In this sequencing, when an adapter or a load is connected to Type C connector 201, energy storage 106 (e.g., capacitor C) is discharged to battery 103 or it is slowly discharged to the Type C Port through switch 215 (e.g., pass FETs Q1 and Q2).

Fourth, the battery controller implements a new sequencing related to protection mode. In this sequencing, in "light load mode", the charger is disabled and the active Vmin protection feature is turned off when the CPU is in low power mode (e.g., states S0i3 or S3-S5).

Energy storage 106 may have a variety of sizes. When energy storage 106 is a capacitor, its value, area and cost can be small. For example, for a 20 us duration of delay in system voltage droop below 5.6V, the charger can supply as much as 81 W (which is comparable to the total SOC power consumption at the very peak) from a capacitor of only 22 uF. A shorter duration (and with lower peak power) would mean that even a smaller capacitor can be used. For a typical charger of 45 W of output power, this means that a 10 uF capacitor would be sufficient. Given that the Prochot# assertion leads to the CPU/SOC power drop in less than 10 us, a capacitor value can be as low as 4.7 uF. Note that the embodiments described herein are not limited to using the capacitors having the sizes specified herein, and one skilled in the art would recognize that other capacitors and energy storage components would serve the purposes described herein.

In one embodiment, a 4.7 uF capacitor with a charger controller controlling the operations described above is all that is required today to accommodate the most peak power requirements from an SOC or CPU on a 2S1P and even 1S2P platforms. In one embodiment, supplementing the power in a system using an energy storage device (e.g., a capacitor) occurs in 1S and 2S systems, which are limited by the system peak power. In one embodiment, charger 202 is delivering the energy from energy storage 106 to supplement battery 103 and to supply system load 205.

Figure 4:
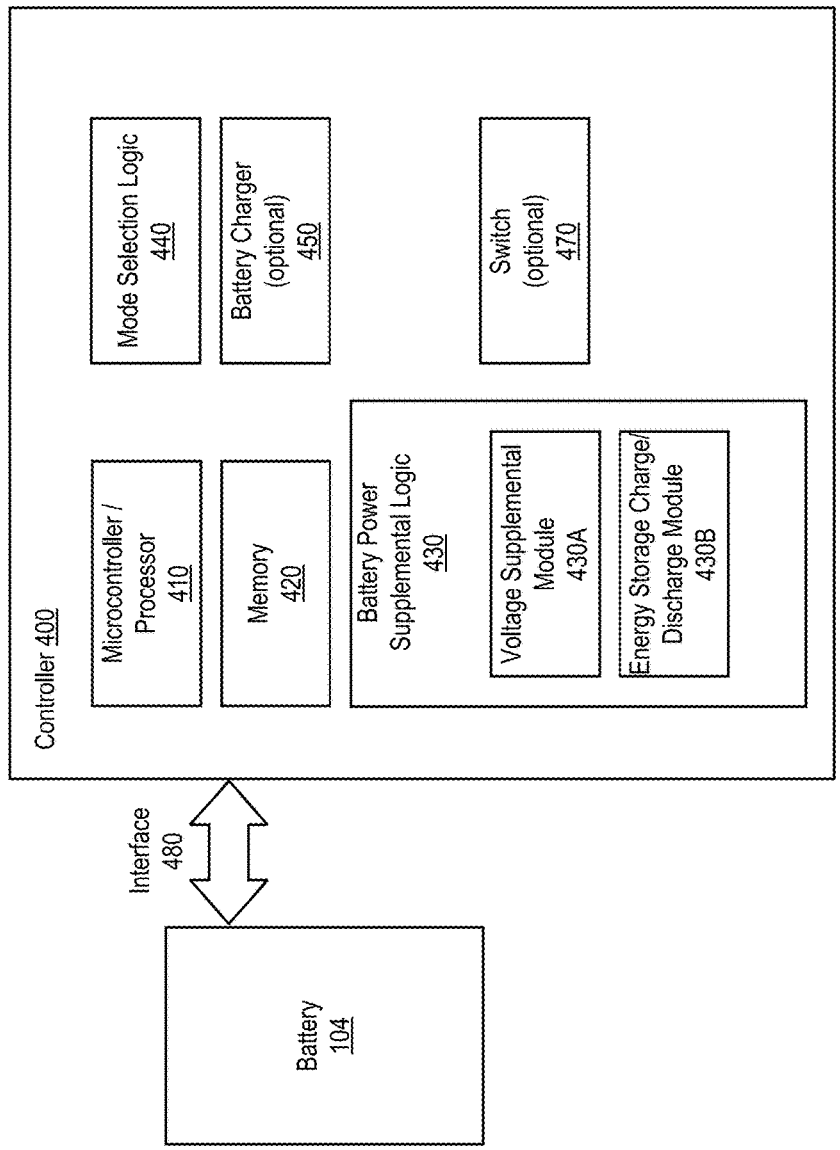
FIG. 4 is a block diagram of one embodiment of a battery controller.

FIG. 4 is a block diagram of one embodiment of a battery controller. In one embodiment, the battery controller is an application specific integrated circuit (ASIC), a digital signal processor (DSP), a field programmable gate array (FPGA), a processor, etc., including the functional blocks depicted in FIG. 4. Alternatively, all or part of controller 400 is implemented as software stored on a memory (e.g., memory 420) and executed by, for example, a processor or microcontroller (e.g., microcontroller/processor 410). In one embodiment, the controller (e.g., a control IC) is part of power management integrated circuit (PMIC). In another embodiment, the controller is part of a fuel gauge. In yet another embodiment, the controller is part of a battery management system.

Referring to FIG. 4, controller 400 interfaces with battery 104 using interface 480. Interface 480 includes a physical interface for supplying power and ground. In one embodiment, interface 480 only provides power and ground. In one embodiment, interface 480 also includes a data interface.

In one embodiment, controller 400 includes at least a processor or microcontroller 410, a memory 420, a battery power supplement logic 430. In one embodiment, battery power supplement logic 430 determines whether the power provided by the battery (e.g., battery 103) of the power supply system is to be supplemented or not from energy storage (e.g., energy storage 106). In one embodiment, battery power supplement logic 430 includes voltage supplemental module 430A that determines whether to supplement the power provided by the battery based on the voltage currently being provided to the system load. This may be based on the voltage monitoring hardware that provides voltage measurements to voltage supplemental module 430A. In one embodiment, if the voltage droops below a threshold, or other predetermined level, yet is above the voltage minimum of the system, then voltage supplemental module 430A triggers and controls the power supply system to have the power provided by the battery to be supplemented by power from the energy storage. This control may include turning on/off switches (e.g., switches 470) in the power delivery system to enable power to flow to the system load or to energy storage and/or protect other components in the system as described above.

In one embodiment, battery power supplement logic 430 includes an energy storage charge and discharge module 430B that controls components, such as energy storage 106, battery charger 102, battery 103 and switches of FIG. 1, to cause the energy storage (e.g., the capacitor) to be charged at times and discharged and/or disabled at other times, such as those described above.

Controller 400 includes mode selection logic 440 that determines when to enter a particular mode, such as, for example, protection mode and protection ready mode described above. In one embodiment, mode selection logic 440 of controller 400 triggers entry into the protection mode when the system voltage level droops below a predetermined threshold level. In one embodiment, mode selection logic 440 of controller 400 triggers entry into the protection ready mode to cause controller 400 to signal the battery charger to charge energy storage to prepare the power supply system for potential entry into protection mode in the future.

While not shown in FIG. 4, in one embodiment, controller 400 includes analog-to-digital converters (ADCs), filters, and a digital amplifier. One or more of the ADC, the filters, and the digital amplifier may be, for example, an ASIC, a DSP, an FPGA, a processor, etc. These elements may be used convert an analog measurement (e.g., battery current and voltage) to a digital value for use in the battery charging control process. For example, the digital amplifier may be a differential amplifier that generates an analog signal based on the voltage drop across the battery (e.g., the difference in voltage values between the positive and negative terminal), which is then converted to a filtered digital value using the ADC and the filter.

In one embodiment, controller 400 includes a battery charger 450 to charge the battery using current charge from the unlimited power supply.

In one embodiment, the critical voltage level of the system voltages when the protection is activated can be adjusted by the system Embedded Controller or the Fuel Gauge or the SOC. The adjustment can be made based on the battery state of charge, peak power projections of the SOC or the rest of the platform, system impedance or changes in system input decoupling, minimum system voltage, etc.

Figure 5:
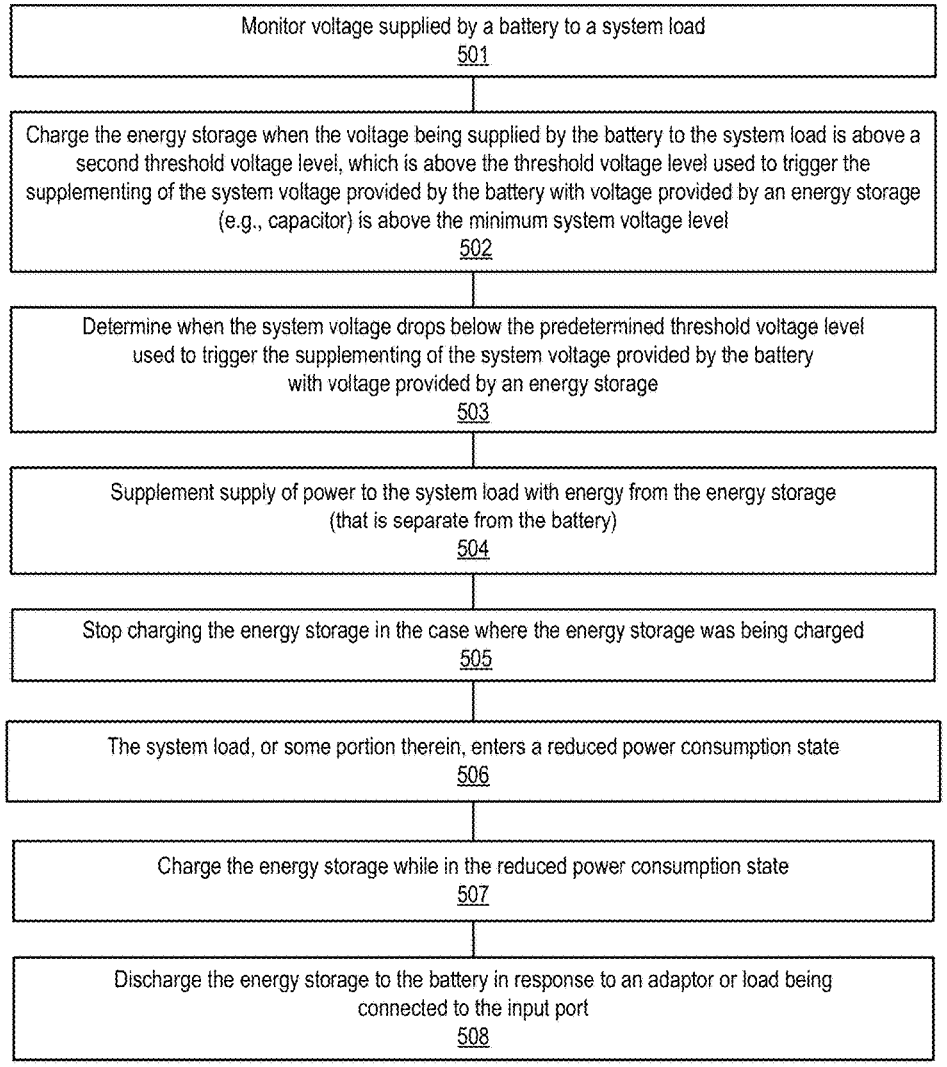
FIG. 5 is a flow diagram of one embodiment of a process for controlling a power supply system for a system load.

FIG. 5 is a flow diagram of one embodiment of a process for controlling a power supply system for a system load. In one embodiment, the process is performed by processing logic that may comprise hardware (circuitry, dedicated logic, etc.), software (such as is run on a general purpose computer system or a dedicated machine), firmware, or a combination of the three. The process may be performed by the power supply systems, including their components, described above.

Referring to FIG. 5, the process begins by processing logic monitoring voltage supplied by a battery to a system load (processing block 501). In one embodiment, the monitoring occurs once the system voltage supplied by the battery to the system load falls below a predetermined threshold voltage level that is above the predetermined threshold voltage level used to trigger the supplementing of the system voltage provided by the battery with voltage provided by an energy storage (e.g., a capacitor). Note that the predetermined threshold voltage level used to trigger the supplementing of the system voltage provided by the battery with voltage provided by an energy storage is above the minimum system voltage level.

Optionally, the process includes processing logic with the charger charging the input energy storage when the voltage being supplied by the battery to the system load is above a second threshold voltage level, which is above the threshold voltage level used to trigger the supplementing of the system voltage provided by the battery with voltage provided by an energy storage is above the minimum system voltage level (processing block 502).

Optionally, the charging of the input energy storage is allowed only when the system is in a high power state, and is disabled when the system is in low power state—excluding the case of a predetermined time delay after the system voltage has crossed the threshold level due to the system power spike.

Processing logic determines when the system voltage drops below the predetermined threshold voltage level used to trigger the supplementing of the system voltage provided by the battery with power provided by an energy storage (processing block 503).

In response to determining that the system voltage has dropped below the predetermined threshold voltage level used to trigger the supplementing of the system voltage, processing logic supplements supply of power to the system load with energy from the energy storage (e.g., capacitor) that is separate from the battery (processing block 504). The supplementing of power maintains the voltage being supplied to the system load above the minimum voltage level.

In one embodiment, in response to determining that the system voltage has dropped below the predetermined threshold voltage level used to trigger the supplementing of the system voltage, optionally, processing logic also stops charging the energy storage in the case where the energy storage was being charged (processing block 505).

In one embodiment, in response to determining that the system voltage has dropped below the predetermined threshold voltage level used to trigger the supplementing of the system voltage, optionally, processing logic also causes the system load, or some portion therein, to enter a reduced power consumption state (processing block 506). In one embodiment, the processing logic asserts a signal (e.g., the Prochot# signal and/or VR_Alert# signal) to the CPU and the peripheral component hub (PCH) to cause the CPU and/or the PCH (or other platform elements) to cuts their power consumption. In one embodiment, the charger asserts Prochot# and starts supplementing the battery almost at the same time, though the supplementing of power is slightly later due to natural delays in the charger circuitry, and the system drops the power sometime after the assertion of Prochot#, but most likely after the charger starts supplementing the battery with the energy from the input storage.

Processing logic causes the energy storage to be charged while in the reduced power consumption state (processing block 507). In one embodiment, this occurs by having the battery charger charge the energy storage. This can occur because the battery is not providing power, or a reduced amount of power, to the system load when in the reduced power consumption state. The reduced power consumption state may be a predetermined programmed special state of the CPU, PCH and other platform elements, or a result of a platform consuming lower power due to low usage of the system.

Subsequently, processing logic may optionally cause the discharging of the energy storage to the battery in response to an adaptor or load being connected to the input port (processing block 508). This may be performed by coupling the energy storage to the battery by turning on one or more switches or through the charger switching regulator. In one embodiment, discharging the energy storage to the battery occurs prior to the adaptor providing power to the computing system through the input port.

Figure 6:
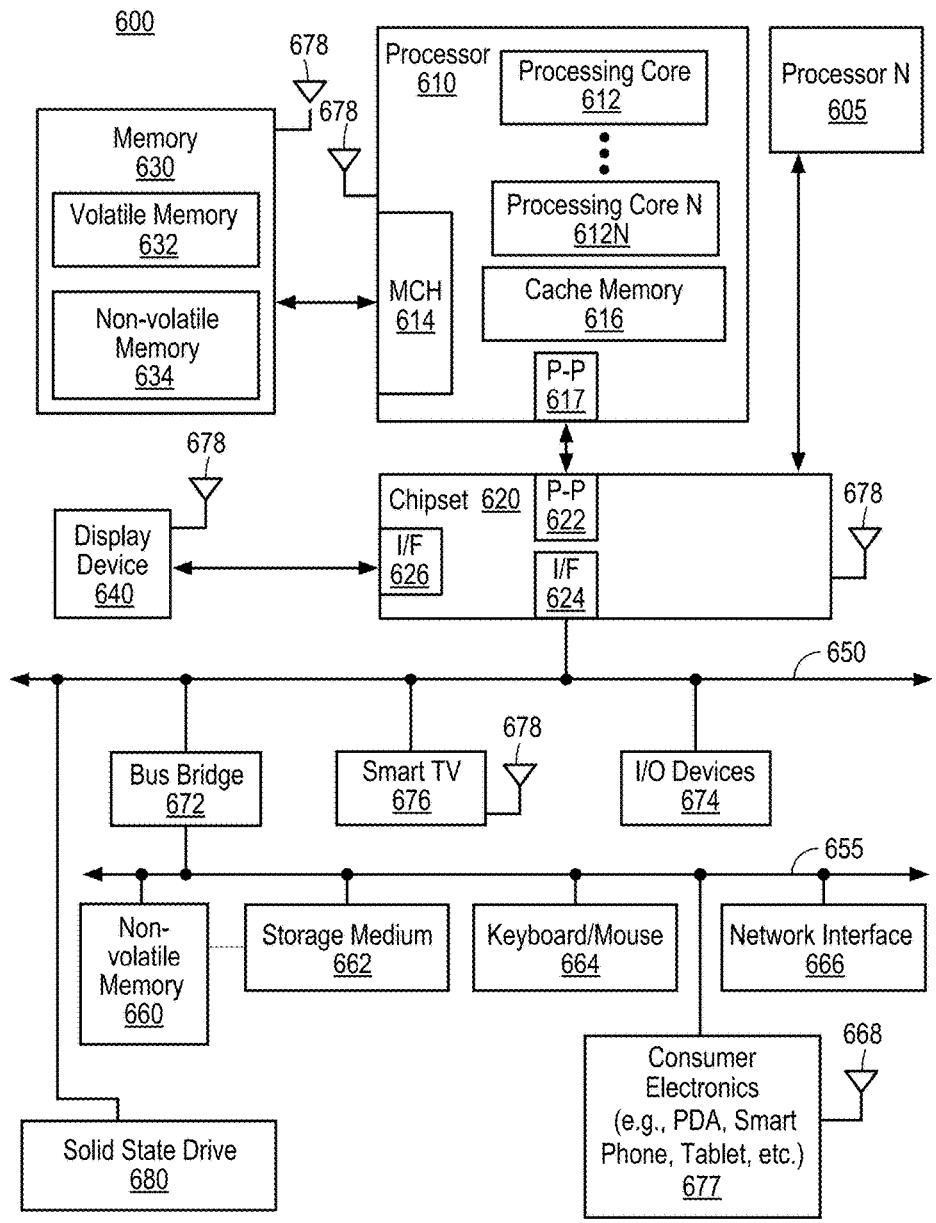
FIG. 6 depicts a block diagram of a system load.

FIG. 6 is one embodiment of a system level diagram 600 that may incorporate the techniques described above. For example, the techniques described above may be used in conjunction with a processor in system 600 or other part of system 600.

Referring to FIG. 6, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, system 600 implements the methods disclosed herein and may be a system on a chip (SOC) system.

In one embodiment, processor 610 has one or more processor cores 612 to 612N, where 612N represents the Nth processor core inside the processor 610 where N is a positive integer. In one embodiment, system 600 includes multiple processors including processors 610 and 605, where processor 605 has logic similar or identical to logic of processor 610. In one embodiment, system 600 includes multiple processors including processors 610 and 605 such that processor 605 has logic that is completely independent from the logic of processor 610. In such an embodiment, a multi-package system 600 is a heterogeneous multi-package system because the processors 605 and 610 have different logic units. In one embodiment, processing core 612 includes, but is not limited to, pre-fetch logic to fetch instructions, decode logic to decode the instructions, execution logic to execute instructions and the like. In one embodiment, processor 610 has a cache memory 616 to cache instructions and/or data of the system 600. In another embodiment of the invention, cache memory 616 includes level one, level two and level three, cache memory, or any other configuration of the cache memory within processor 610.

In one embodiment, processor 610 includes a memory control hub (MCH) 614, which is operable to perform functions that enable processor 610 to access and communicate with a memory 630 that includes a volatile memory 632 and/or a non-volatile memory 634. In one embodiment, memory control hub (MCH) 614 is positioned outside of processor 610 as an independent integrated circuit.

In one embodiment, processor 610 is operable to communicate with memory 630 and a chipset 620. In such an embodiment, SSD 680 executes the computer-executable instructions when SSD 680 is powered up.

In one embodiment, processor 610 is also coupled to a wireless antenna 678 to communicate with any device configured to transmit and/or receive wireless signals. In one embodiment, wireless antenna interface 678 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory (e.g., NAND, NOR), phase change memory (PCM), read-only memory (ROM), electrically erasable programmable read-only memory (EEPROM), or any other type of non-volatile memory device.

Memory 630 stores information and instructions to be executed by processor 610. In one embodiment, chipset 620 connects with processor 610 via Point-to-Point (PtP or P-P) interfaces 617 and 622. In one embodiment, chipset 620 enables processor 610 to connect to other modules in the system 600. In one embodiment, interfaces 617 and 622 operate in accordance with a PtP communication protocol such as the Intel QuickPath Interconnect (QPI) or the like.

In one embodiment, chipset 620 is operable to communicate with processor 610, 605, display device 640, and other devices 672, 676, 674, 660, 662, 664, 666, 677, etc. In one embodiment, chipset 620 is also coupled to a wireless antenna 678 to communicate with any device configured to transmit and/or receive wireless signals.

In one embodiment, chip set 620 connects to a display device 640 via an interface 626. In one embodiment, display device 640 includes, but is not limited to, liquid crystal display (LCD), plasma, cathode ray tube (CRT) display, or any other form of visual display device. In addition, chipset 620 connects to one or more buses 650 and 655 that interconnect various modules 674, 660, 662, 664, and 666. In one embodiment, buses 650 and 655 may be interconnected together via a bus bridge 672 if there is a mismatch in bus speed or communication protocol. In one embodiment, chipset 620 couples with, but is not limited to, a non-volatile memory 660, a mass storage device(s) 662, a keyboard/mouse 664, and a network interface 666 via interface 624, smart TV 676, consumer electronics 677, etc.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface.

While the modules shown in FIG. 6 are depicted as separate blocks within the system 600, the functions performed by some of these blocks may be integrated within a single semiconductor circuit or may be implemented using two or more separate integrated circuits.

There are a number of example embodiments described herein.

Example 1 is an apparatus comprising voltage monitoring hardware to monitor voltage being supplied by a battery to a system load and an energy storage coupled to the voltage monitoring hardware to supplement supply of power to the system load when the voltage supplied to the system load by the battery, as monitored by the voltage monitoring hardware, drops below a first threshold voltage level, the first threshold voltage level being above a minimum voltage level associated with the computing system.

Example 2 is the apparatus of example 1 that may optionally include that the energy storage comprises one or more capacitor.

Example 3 is the apparatus of example 1 that may optionally include that the energy storage comprises one or more components for input decoupling of charger circuitry for charging the battery.

Example 4 is the apparatus of example 1 that may optionally include that the energy storage is operable to supplement power to the system load to maintain the voltage being supplied to the system load above the minimum voltage level.

Example 5 is the apparatus of example 1 that may optionally include that the energy storage is operable to supplement the power to the system load after power consumption of the system load rises above the voltage level supportable by the battery.

Example 6 is the apparatus of example 5 that may optionally include that the energy storage is charged while in the reduced power consumption state.

Example 7 is the apparatus of example 5 that may optionally include that the energy storage is charged during the time when the system load consumes less power than a peak power spike.

Example 8 is the apparatus of example 1 that may optionally include the battery; and a battery charger to charge the battery that is to supply power to the system load and to charge the energy storage when the battery is supplying the power to the system load and the voltage being supplied by the battery to the system load is above the first threshold voltage level.

Example 9 is the apparatus of example 8 that may optionally include that the battery charger is operable to charge the energy storage when the voltage being supplied by the battery to the system load is above the second threshold voltage level that is higher than the first threshold voltage level and does not charge the energy storage when the voltage being supplied by the battery to the system load is below the second threshold voltage level but higher than the first threshold voltage level, and the voltage monitoring hardware is operable to monitor the voltage being supplied by the battery to the system load after the voltage drops below the second threshold voltage level.

Example 10 is the apparatus of example 8 that may optionally include an input port coupled to the battery charger, and wherein the energy storage is discharged in response to an adaptor or load is connected to the input port.

Example 11 is the apparatus of example 10 that may optionally include that the energy storage is discharged in response to the adaptor being connected to the input port but prior to the adaptor providing power to the computing system through the input port.

Example 12 is a non-transitory machine-readable medium having stored thereon one or more instructions, which if performed by a machine causes the machine to perform a method comprising: monitoring voltage supplied by a battery to a system load; and supplementing supply of power to the system load from an energy storage separate from the battery when the voltage supplied to the system load by the battery drops below a first threshold voltage level, the first threshold voltage level being above a minimum voltage level associated with system load.

Example 13 is non-transitory machine-readable medium of example 12 that may optionally include that the energy storage comprises one or more capacitors coupled together.

Example 14 is non-transitory machine-readable medium of example 12 that may optionally include that supplementing supply of power to the system load from an energy storage is performed to maintain the voltage being supplied to the system load above the minimum voltage level.

Example 15 is non-transitory machine-readable medium of example 12 that may optionally include that supplementing supply of power to the system load from an energy storage occurs after the system load rises above the voltage level supportable by the battery.

Example 16 is non-transitory machine-readable medium of example 15 that may optionally include that the method further comprises charging the energy storage while in the reduced power consumption state.

Example 17 is non-transitory machine-readable medium of example 12 that may optionally include that the method further comprises charging the energy storage when the voltage being supplied by the battery to the system load is above a second threshold voltage level which is above the first threshold voltage level, and further wherein supplementing supply of power to the system load from an energy storage occurs when the voltage being supplied by the battery to the system load is below the second threshold voltage level but higher than the first threshold voltage level.

Example 18 is non-transitory machine-readable medium of example 17 that may optionally include that the method further comprises monitoring the voltage being supplied by the battery to the system load after the voltage drops below the second threshold voltage level.

Example 19 is non-transitory machine-readable medium of example 18 that may optionally include that the method further comprises discharging the energy storage to the battery in response to an adaptor or load being connected to the input port.

Example 20 is non-transitory machine-readable medium of example 19 that may optionally include that discharging the energy storage to the battery occurs prior to the adaptor providing power to the system load through the input port.

Example 21 is a method comprising: monitoring voltage supplied by a battery to a system load; and supplementing supply of power to the system load from an energy storage separate from the battery when the voltage supplied to the system load by the battery drops below a first threshold voltage level, the first threshold voltage level being above a minimum voltage level associated with system load.

Example 22 is method of example 21 that may optionally include that the energy storage comprises one or more capacitors coupled together.

Example 23 is non-transitory machine-readable medium of example 21 that may optionally include that supplementing supply of power to the system load from an energy storage is performed to maintain the voltage being supplied to the system load above the minimum voltage level.

Example 24 is non-transitory machine-readable medium of example 21 that may optionally include that supplementing supply of power to the system load from an energy storage occurs after the system load rises above the voltage level supportable by the battery.

Example 25 is method of example 21 that may optionally include charging the energy storage when the voltage being supplied by the battery to the system load is above a second threshold voltage level which is above the first threshold voltage level, and further wherein supplementing supply of power to the system load from an energy storage occurs when the voltage being supplied by the battery to the system load is below the second threshold voltage level but higher than the first threshold voltage level.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An apparatus comprising:
voltage monitoring hardware to monitor voltage being supplied by a battery to a system load;
an energy storage coupled to the voltage monitoring hardware to supplement supply of power to the system load when the voltage supplied to the system load by the battery, as monitored by the voltage monitoring hardware, drops below a first threshold voltage level, the first threshold voltage level being above a minimum voltage level associated with the system; and
a battery charger to charge the battery that is to supply power to the system load and to charge the energy storage when the battery is supplying the power to the system load and the voltage being supplied by the battery to the system load is above a second threshold voltage level that is higher than the first threshold voltage level and does not charge the energy storage when the voltage being supplied by the battery to the system load is below the second threshold voltage level but higher than the first threshold voltage level, the voltage monitoring hardware being operable to monitor the voltage supplied by the battery to the system load after the voltage drops below the second threshold voltage level.

2. The apparatus defined in claim 1 wherein the energy storage comprises one or more capacitors.

3. The apparatus defined in claim 1 wherein the energy storage comprises one or more components for input decoupling of charger circuitry for charging the battery.

4. The apparatus defined in claim 1 wherein the energy storage is operable to supplement power to the system load to maintain the voltage being supplied to the system load above the minimum voltage level.

5. The apparatus defined in claim 1 wherein the energy storage is operable to supplement the power to the system load after power consumption of the system load rises above the voltage level supportable by the battery.

6. The apparatus defined in claim 5 wherein the energy storage is charged while in a reduced power consumption state.

7. The apparatus defined in claim 5 wherein the energy storage is charged when the system load consumes less power than a peak power spike.

8. The apparatus defined in claim 1 further comprising: the battery.

9. The apparatus defined in claim 8 further comprising:
an input port coupled to the battery charger, and wherein the energy storage is discharged in response to an adaptor or load is connected to the input port.

10. The apparatus defined in claim 9 wherein the energy storage is discharged in response to the adaptor being connected to the input port but prior to the adaptor providing power to the computing system through the input port.

11. A non-transitory machine-readable medium having stored thereon one or more instructions, which if performed by a machine causes the machine to perform a method comprising:
monitoring voltage supplied by a battery to a system load; and
supplementing supply of power to the system load from an energy storage separate from the battery when the voltage supplied to the system load by the battery drops below a first threshold voltage level, the first threshold voltage level being above a minimum voltage level associated with system load and
charging the energy storage when the voltage being supplied by the battery to the system load is above a second threshold voltage level which is above the first threshold voltage level, and further wherein supplementing supply of power to the system load from an energy storage occurs when the voltage being supplied by the battery to the system load is below the second threshold voltage level but higher than the first threshold voltage level.

12. The machine-readable medium defined in claim 11 wherein the energy storage comprises one or more capacitors coupled together.

13. The machine-readable medium defined in claim 11 wherein supplementing supply of power to the system load from an energy storage is performed to maintain the voltage being supplied to the system load above the minimum voltage level.

14. The machine-readable medium defined in claim 11 wherein supplementing supply of power to the system load from an energy storage occurs after the system load rises above the voltage level supportable by the battery.

15. The machine-readable medium defined in claim 14 wherein the method further comprises charging the energy storage while in the reduced power consumption state.

16. The machine-readable medium defined in claim 11 wherein the method further comprises.

17. The machine-readable medium defined in claim 16 wherein the method further comprises monitoring the voltage being supplied by the battery to the system load after the voltage drops below the second threshold voltage level.

18. The machine-readable medium defined in claim 17 wherein the method further comprises discharging the energy storage to the battery in response to an adaptor or load being connected to an input port.

19. The machine-readable medium defined in claim 18 wherein discharging the energy storage to the battery occurs prior to the adaptor providing power to the system load through the input port.

20. A method comprising:
monitoring voltage supplied by a battery to a system load; and
supplementing supply of power to the system load from an energy storage separate from the battery when the voltage supplied to the system load by the battery drops below a first threshold voltage level, the first threshold voltage level being above a minimum voltage level associated with system load; and
charging the energy storage when the voltage being supplied by the battery to the system load is above a second threshold voltage level which is above the first threshold voltage level, and further wherein supplementing supply of power to the system load from an energy storage occurs when the voltage being supplied by the battery to the system load is below the second threshold voltage level but higher than the first threshold voltage level.

21. The method defined in claim 20 wherein the energy storage comprises one or more capacitors coupled together.

22. The method defined in claim 20 wherein supplementing supply of power to the system load from an energy storage is performed to maintain the voltage being supplied to the system load above the minimum voltage level.

23. The method defined in claim 20 wherein supplementing supply of power to the system load from an energy storage occurs after the system load rises above the voltage level supportable by the battery.

* * * * *